United States Patent [19]

Fuller et al.

[11] Patent Number: 4,659,426
[45] Date of Patent: Apr. 21, 1987

[54] PLASMA ETCHING OF REFRACTORY METALS AND THEIR SILICIDES

[75] Inventors: Clyde R. Fuller, Plano; Gordon P. Pollack, Richardson; Robert H. Eklund, Plano, all of Tex.; Dave Monahan, Palo Alto, Calif.

[73] Assignee: Texas Instruments Incorporated, Dallas, Tex.

[21] Appl. No.: 730,717

[22] Filed: May 3, 1985

[51] Int. Cl.$^4$ .................. H01L 21/306; C23F 1/02; B44C 1/22; C03C 15/00
[52] U.S. Cl. .................. 156/643; 156/646; 156/656; 156/657; 156/659.1; 156/662; 204/192.32; 252/79.1
[58] Field of Search .......... 156/643, 646, 656, 657, 156/659.1, 662; 204/192 E; 427/38, 39, 88–91; 252/79.1

[56] References Cited

U.S. PATENT DOCUMENTS

| | | | |
|---|---|---|---|
| 4,243,476 | 1/1981 | Ahn et al. | 156/646 X |
| 4,260,649 | 4/1981 | Dension et al. | 156/635 X |
| 4,444,617 | 4/1984 | Whitcomb | 252/79.1 X |
| 4,473,436 | 9/1984 | Beinvogl | 156/643 |
| 4,529,475 | 7/1985 | Okano et al. | 156/646 X |

Primary Examiner—William A. Powell
Attorney, Agent, or Firm—Robert Groover, III; James T. Comfort; Melvin Sharp

[57] ABSTRACT

Refractory metals, refractory metal silicide, and polysilicon/refractory metal silicide sandwich structures integrated circuits are etched using carbonyl chemistry. That is, the deposited material is plasma etched using an etchant gas mixture which contains a gas, such as $CO_2$, which can dissociate to provide carbonyl groups (CO) or, in combination with halogen sources, carbonyl halide radicals.

45 Claims, No Drawings

PLASMA ETCHING OF REFRACTORY METALS AND THEIR SILICIDES

BACKGROUND AND SUMMARY OF THE INVENTION

The present invention relates to fabrication of integrated circuits. In particular, this invention relates to methods of etching thin films of refractory metals, metal silicides, polycides, and metal/polysilicon sandwich structures by plasma or reactive ion etching to form interconnects for VLSI integrated circuits.

As MOS integrated circuit complexity has increased, the circuit performance gains which normally result from the decreases in individual circuit component size with scaling have begun to be limited by the RC time constant characteristics of the long interconnects required to interconnect the increased number of circuit components. To reduce the resistance component of these long length interconnects, integrated circuit manufacturers have been turning to refractory metals, refractory metal silicides, and polysilicon/refractory metal silicide composite films (referred to as polycides) to replace the polysilicon conventionally used for gate level interconnects. Such materials offer interconnect sheet resistances of one to three ohms per square, compared to ten ohms per square or more for polysilicon alone.

However, this use of new materials has introduced new processing problems. Dry etching (plasma or reactive ion etching) has long been the accepted method of etching patterns in polysilicon to provide integrated circuit gate and/or interconnect levels. The chemistry to provide anisotropic etching of polysilicon with good differential etch rate with respect to silicon dioxide is widely known. However, the patterning of polycides offers unique problems which the chemistries conventionally used for polysilicon dry etching do not meet; these chemistries do not maintain anisotropy for both the polysilicon and the refractory metal silicide such that the edges of the two layers in these composite films remain coincident. That is, for etching polycide films, it is desirable to have a single etchant gas mixture which will not only etch both materials, but will etch them so that the layered polycide structure has a predictably vertical edge afterwards.

The present invention not only solves the coincident edge etching requirements for polycide films, but also provides a method for patterning the full family of refractory metals, refractory metal silicides, and certain other metals.

The present invention teaches an integrated circuit plasma etching method which can be used to pattern interconnects using any metal or combination of metals which form volatile carbonyls and carbonyl halides over silicon dioxide or polysilicon, by etching the metal (or metal silicide) and (optionally) polysilicon anisotropically such that the polysilicon and refractory metal (or refractory metal silicide) layers have coincident edges.

In the prior art, polysilicon/refractory metal and metal silicide composite films were plasma or reactive ion etched using halogen chemistry. However, chlorine bearing gases, which etch polysilicon well, generally etch refractory metal or metal silicides at a slower rate. This results in undercut of the polysilicon layer of the polycide films. Other etch gas chemistries, based on fluorine-bearing gases, do provide coincident edges for the silicide and polysilicon layers in polycide films. However, such etching processes suffer from two disadvantages: first, they tend to be relatively isotropic, resulting in substantial line width narrowing of the etched film; second, they exhibit poor selectivity to silicon oxides. Thus, the use of halogen chemistries for plasma etching combinations of refractory metals or silicides with polysilicon is inadequate for mass production of VLSI integrated circuits.

The present invention solves these problems and provides a major advance in the art of plasma etching for fabrication of integrated circuits, by using plasma etch gas compositions which volatilize the metal fraction of interconnect layers as volatile metal carbonyls and/or carbonyl halides. Metal carbonyls and carbonyl halides have been used extensively in bulk chemical processing, and have been discussed extensively in the chemical literature, but the application of carbonyl chemistry to solve the unique problems which occur in etching of integrated circuits is believed not to have been suggested prior to the present invention.

The first metal carbonyl was discovered in 1890 when Mond, Langer, and Quinchy observed nickel carbonyl as the product of the reaction between nickel metal and carbon monoxide at 30 degrees centigrade. Since then, substantial study of carbonyls and carbonyl halides has led to a large number of publications and numerous applications for metal carbonyls. For example, nickel carbonyl has been used to deposit nickel thin films. Metal carbonyls have been used in refining titanium, zirconium, and hafnium. In organic synthesis, metal carbonyls have been used to stabilize systems that are normally unstable. A major application of metal carbonyls in organic chemistry is the use of nickel carbonyl in the synthesis of acrylates from acetylene and carbon monoxide.

That is, the existence of volatile carbonyl species is known in the chemical literature, but no known prior art teaches the patterned plasma etching of thin films using a carbonyl source gas. Similarly, the existence of the species gold carbonyl chloride $(Au(COCl)_x)$ has been recently reported in the literature, but no known literature or other prior art teaches patterned plasma etching of thin films incorporating a metal component which can be volatilized as a carbonyl chloride.

The present invention provides a new advantageous class of integrated circuit etching processes, using halogen based gases (such as carbon tetrachloride, silicon tetrachloride, or a Freon TM such as $CFCl_3$) with carbon monoxide or carbon dioxide in a plasma (or RIE) reactor to etch a metal or metal composite or compound by volatilization of the metal in the thin film as a carbonyl or carbonyl halide.

According to the present invention, there is provided: A method for patterning thin-film interconnects, comprising the steps of:
  depositing a thin film of a composite layer structure comprising both polycrystalline silicon and a metal silicide on a predetermined substrate, having a patterned masking material in a predetermined pattern thereon;
  providing a reagent gas flow in proximity to said thin film of metal, said reagent gas flow including a carbonyl source gas; and
  applying rf power to create a plasma in proximity to said thin film of metal.

According to the present invention, there is provided: A method for patterning thin-film metallization, comprising the steps of:
  depositing a thin film of a metal on a predetermined substrate, having a patterned masking material in a predetermined pattern thereon;
  providing a reagent gas flow in proximity to said thin film of metal, said reagent gas flow including a carbonyl source gas; and
  applying rf power to create a plasma in proximity to said thin film of metal.

According to the present invention, there is provided: A method for patterning thin-film interconnects, comprising the steps of:
  depositing a thin film of a metal silicide on a predetermined substrate, having a patterned masking material in a predetermined pattern thereon;
  providing a reagent gas flow in proximity to said thin film of metal silicide, said reagent gas flow including a carbonyl source gas; and
  applying rf power to create a plasma in proximity to said thin film of metal silicide.

According to the present invention, there is provided: A method for patterning thin-film interconnects, comprising the steps of:
  depositing a thin film of a composite layer structure comprising both polycrystalline silicon and a metal silicide on a predetermined substrate, having a patterned masking material in a predetermined pattern thereon;
  providing a reagent gas flow in proximity to said thin film of metal, said reagent gas flow including a halogen source and including a carbonyl source gas; and
  applying rf power to create a plasma in proximity to said thin film of metal.

BRIEF DESCRIPTION OF THE DRAWINGS

No drawings are included with the present application.

DESCRIPTION OF THE PREFERRED EMBODIMENTS

As will be recognized by those skilled in the art, the present invention provides a very broad innovation in integrated circuit processing. The present invention does not teach merely one process, but a whole class of processes which have not been used before in integrated circuit processing. Accordingly, the scope of the present invention is extremely broad, and is not limited except as specified in the accompanying claims. In particular, sample species of reagent gas and interconnect material are provided by way of illustration, but the present invention is generic to processes using a wide variety of etchant gas mixtures including a carbonyl source to etch a wide variety of interconnect materials.

Various embodiments of the present invention etch various thin film interconnect materials, (including metals, metal silicides, and polysilicon/silicide composites (polycides)) with a reagent gas mixture which includes a carbonyl source (which may be carbon monoxide, carbon dioxide, or another carbonyl source gas), preferably combined with a halogen source gas, in proximity to a plasma under conditions which are favorable to the formation of the carbonyl or carbonyl halide of the metal species included in the interconnect material being etched.

Etching under these conditions has been found to work successfully with a variety of materials and a variety of reagent gases. However, the exact chemical mechanism of etching is not known with precision. It is believed that etching results from one or more of the following chemical processes:

1. Dissociation of carbon dioxide into carbon monoxide (or carbonyl ions) and atomic oxygen, followed by reaction of the carbon monoxide with the metal being etched.

2. Dissociation of carbon dioxide into carbon monoxide (or carbonyl ions) and atomic oxygen, followed by reaction of the carbon monoxide with the halogen source gas, or with free radicals or ionic species formed in the plasma from the halogen source gas, to form a carbonyl halide. The carbonyl halide may be a stable species, such as $CFCl_2$, or may also be a free radical or ionic species. The carbonyl halide then reacts with the metal being etched, to carry it off as a gaseous metal carbonyl halide.

3. Simultaneous reaction of the products of halogen-bearing species with the metal species to form a metal halide intermediate, together with dissociation of carbon dioxide in carbon monoxide and atomic oxygen, followed by reaction of the carbon monoxide with the metal halides to form a metal carbonyl halide gaseous etch product.

4. Embodiments using carbon monoxide instead of carbon dioxide may follow reaction pathways analogous to examples 1, 2, and 3, but without the $CO_2$ dissociation step.

5. Direct formation of a metal carbonyl halide by reaction with a gas such as carbonyl chloride.

As is well-known in the art of plasma etching, other gases such as helium or oxygen may be added to obtain the desired control of substrate temperature and photoresist erosion.

It should also be noted that the present invention is applicable both to high-pressure and low-pressure plasma etching regimes. That is, the present invention is applicable both to processes known as reactive ion etching or RIE, which operate at pressures from 100 microns or so down to a few microns (milliTorr), as well as more conventional plasma etching processes which operate at pressures from 100 microns up to several thousand microns (or, less preferably, even higher).

Where silicides or polycides are being etched, it is preferable to include a halogen source (preferably a chlorine source) with the carbonyl source gas. This assists in volatilizing the silicon component of the compound or composite. In particular, it has been found that source gas mixtures including both a carbonyl and a chlorine source will etch silicides and polycides efficiently. In particular, various embodiments of the present invention will etch stacked composites of these materials so that all overlying portions of the finally etched structure have coincident edges, i.e. etching leaves the linewidth of the various layers of the stack equal. As is well-known in the art of plasma etching of polysilicon, silicon can be volatilized as silicon tetrachloride. It is also possible, when using the present invention, that some fraction of the silicon may be volatilized as an oxychloride.

It should be noted that the present invention has been used to etch such difficult to etch materials as copper and gold. However, the present invention is very difficult to apply to etching of aluminum, since the competing reaction of oxidation of aluminum to form the very nonvolatile species aluminum oxide tends to create a residue which stops etching. However, it should be noted that the present invention is not even necessarily inapplicable to all metals which have a strong tendency to form solid oxides: for example, the present invention works well with titanium silicide, even though titanium dioxide is an inconveniently stable solid oxide. It should be noted that ion bombardment may assist in disrupting such competing oxidation reactions. In species where this is the case, the competing reaction pathways may provide a sidewall passivation characteristic which assists in etch anisotropy.

A first sample specific embodiment of the present invention is used for etching a thin film of molybdenum disilicide over silicon dioxide in an Anelva DEA 503 (TM) reactive ion etcher, is as follows: the etch gases were carbon tetrachloride, fed at 10 standard cc's per minute (SCCM); carbon dioxide, fed at 15 SCCM; and oxygen, fed at 2 SCCM. The pressure was 30 milliTorr. The power was 250 watts. The measured DC self bias voltage was 62 volts. The wafer being etched was allowed to remain at ambient temperature. Using these parameters, a 2500 angstrom thin film of molybdenum disilicide film was etched with roughly one micron lines and spaces at an etch rate of about 300 angstroms per minute. The etch was found to be selective to silicon dioxide. The anisotropy of the etch was good: the etch lines appeared to have a sidewall slope greater than four to one. A conventional photoresist was used, and selectivity to photoresist was found to be adequate.

In another sample embodiment of the present invention, a Texas Instruments A24D plasma etcher was used to etch a composite film consisting of 3600 angstroms of molybdenum disilicide over 2300 angstroms of doped polysilicon. The etch rates obtained were 600 angstroms per minute for the molybdenum disilicide and 1200 angstroms per minute for the doped polysilicon. The etch conditions used were: the etch gases were fluoro-trichloromethane, flowed at 100 SCCM, and carbon dioxide, flowed at 200 SCCM; the pressure was 0.28 Torr; the power was 600 watts; the electrode spacing was one-half inch; and the substrate temperature was held at 50 degrees C. during etching. The etched stacked had substantially coincident edges for all layers, as desired.

It should be noted that the present invention will frequently produce residues in the etched area. These residues clean up very well in piranha (a mixture of concentrated sulfuric acid and 30% hydrogen peroxide, commonly used in the semiconductor industry to remove possible organic residues).

Other sample specific embodiments of the present invention have demonstrated etching of tantalum silicide, copper, gold, tungsten silicide, and titanium silicide.

It should be noted that the present invention is particularly advantageous for etching word lines in large dynamic memory arrays. That is, the resistivity of polysilicon simply cannot be made low enough to get acceptable word line speed at, for example, one micron line width in a subarray of 256,000 memory cells. Thus, it has been generally recognized in the semiconductor art that it is very attractive to use silicides, polycides, or straight refractory metals for the word lines in dRAM arrays. However, etching of these materials presents substantial problems, since many of the most desirable refractory metals, such as molybdenum, will exhibit difficult etching characteristics, due to the same chemical properties which are likely to make them provide a good interface to the gate insulator and to the overlying oxide during subsequent high-temperature processing steps. The present invention solves this problem. A particular difficulty with etching refractory metals and refractory metal silicides is that the conditions conventionally used to etch them are quite harsh (for example, fluorine-based etches are conventionally used for etching tungsten); but in etching gate levels (such as the word lines in a dRAM array) containing these materials, it is necessary to stop on a very thin gate oxide, and with a minimum of erosion of that oxide. For example, if a 2500 angstrom thick molybdenum silicide line is being etched, it will typically be necessary to stop on a gate oxide which is 300 or fewer angstroms thick. Some overetching is always necessary in any production plasma etching process, to compensate for process variations, topology, non-uniformity of etching rates across the width of the wafer, and/or imprecise endpoint detection, so that good selectivity to oxide is required. Many of the conventional etches used for refractory metals, noble metals, or refractory metal silicides or noble metal silicides do not provide this capability. A major advantage of the present invention is that it does provide this capability. That is, the oxide which is exposed to the etch conditions will normally be stripped and regrown, but it is still desirable to minimize the damage to the exposed sacrificial portions of the oxide, since this will improve the resulting quality of the oxide under the corners of the gates, which remains in place in the final device, and is typically a major source of any gate leakage current which may occur.

However, while the present invention is particularly advantageous in manufacture of large dynamic random access memory arrays, it is also advantageous in fabrication of other VLSI integrated circuits. The RC time constant of any interconnect line degrades with scaling the small geometries, since the resistance of the line continues to increase as the cross section gets smaller, but the rate of decrease of the capacitance with small geometries is reduced due to the fringing field component of distributed capacitance. This very general problem has prompted a general search in the art of integrated circuits for interconnect materials having as low a resistivity as possible; but many of the candidate materials are relatively intractable in processing. The present invention makes processing of small-geometry interconnects in such materials much more reliable, and therefore provides a major advance in the capability of the integrated circuit art to use new low-resistivity materials. Since these problems are absolutely universal in the scaling of any integrated circuit architecture to very small geometries, the present invention is advantageous in the context of many device processes, and is widely applicable.

As will be recognized by those skilled in the art of semiconductor integrated circuit fabrication, the present invention teaches a concept of broad and fundamental novelty, which can be embodied in a tremendous variety of contexts. The scope of the present invention is therefore expressly not limited except as set forth in the accompanying claims.

What is claimed is:

1. A method for patterning thin-film interconnects, comprising the steps of:
   depositing a thin film of a composite layer structure comprising both polycrystalline silicon and a metal silicide on a predetermined substrate, having a patterned masking material in a predetermined pattern thereon;

providing a reagent gas flow in proximity to said thin film of metal, said reagent gas flow including a carbonyl source gas; and applying rf power to create a plasma in proximity to said thin film of metal.

2. A method for patterning thin-film metallization, comprising the steps of:

depositing a thin film of a metal on a predetermined substrate, having a patterned masking material in a predetermined pattern thereon;

providing a reagent gas flow in proximity to said thin film of metal, said reagent gas flow including a carbonyl source gas; and applying rf power to create a plasma in proximity to said thin film of metal.

3. A method for patterning thin-film interconnects, comprising the steps of:

depositing a thin film of a metal silicide on a predetermined substrate, having a patterned masking material in a predetermined pattern thereon;

providing a reagent gas flow in proximity to said thin film of metal silicide, said reagent gas flow including a carbonyl source gas; and applying rf power to create a plasma in proximity to said thin film of metal silicide.

4. A method for patterning thin-film interconnects, comprising the steps of:

depositing a thin film of a composite layer structure comprising both polycrystalline silicon and a metal silicide on a predetermined substrate, having a patterned masking material in a predetermined pattern thereon;

providing a reagent gas flow in proximity to said thin film of metal, said reagent gas flow including a halogen source and including a carbonyl source gas; and applying rf power to create a plasma in proximity to said thin film of metal.

5. A method for patterning thin-film metallization, comprising the steps of:

depositing a thin film of a metal on a predetermined substrate, having a patterned masking material in a predetermined pattern thereon;

providing a reagent gas flow in proximity to said thin film of metal, said reagent gas flow including a halogen source and including a carbonyl source gas; and applying rf power to create a plasma in proximity to said thin film of metal.

6. A method for patterning thin-film interconnects, comprising the steps of:

depositing a thin film of a metal silicide on a predetermined substrate, having a patterned masking material in a predetermined pattern thereon;

providing a reagent gas flow in proximity to said thin film of metal silicide, said reagent gas flow including a halogen source and including a carbonyl source gas; and applying rf power to create a plasma in proximity to said thin film of metal silicide.

7. The method of claim 1, wherein said carbonyl source comprises carbon dioxide.

8. The method of claim 2, wherein said carbonyl source comprises carbon dioxide.

9. The method of claim 3, wherein said carbonyl source comprises carbon dioxide.

10. The method of claim 4, wherein said carbonyl source comprises carbon dioxide.

11. The method of claim 5, wherein said carbonyl source comprises carbon dioxide.

12. The method of claim 6, wherein said carbonyl source comprises carbon dioxide.

13. The method of claim 1, wherein said carbonyl source comprises carbon monoxide.

14. The method of claim 2, wherein said carbonyl source comprises carbon monoxide.

15. The method of claim 3, wherein said carbonyl source comprises carbon monoxide.

16. The method of claim 4, wherein said carbonyl source comprises carbon monoxide.

17. The method of claim 5, wherein said carbonyl source comprises carbon monoxide.

18. The method of claim 6, wherein said carbonyl source comprises carbon monoxide.

19. The method of claim 4, wherein said halogen source comprises a gaseous chlorine bearing species.

20. The method of claim 5, wherein said halogen source comprises a gaseous chlorine bearing species.

21. The method of claim 6, wherein said halogen source comprises a gaseous chlorine bearing species.

22. The method of claim 2, wherein said metal is selected from the group consisting of platinum, tantalum, niobium, columbium, rhodium, and palladium.

23. The method of claim 5, wherein said metal is selected from the group consisting of platinum, tantalum, niobium, columbium, rhodium, and palladium.

24. The method of claim 1, wherein said silicide is selected from the group consisting of titanium silicide, tungsten silicide, molybdenum silicide, cobalt silicide, and nickel silicide.

25. The method of claim 3, wherein said silicide is selected from the group consisting of titanium silicide, tungsten silicide, molybdenum silicide, cobalt silicide, and nickel silicide.

26. The method of claim 4, wherein said silicide is selected from the group consisting of titanium silicide, tungsten silicide, molybdenum silicide, cobalt silicide, and nickel silicide.

27. The method of claim 6, wherein said silicide is selected from the group consisting of titanium silicide, tungsten silicide, molybdenum silicide, cobalt silicide, and nickel silicide.

28. The method of claim 4, wherein said halogen source gas is selected from the group consisting of carbon tetrachloride silicon tetrachloride, and fluorotrichloromethane.

29. The method of claim 5, wherein said halogen source gas is selected from the group consisting of carbon tetrachloride silicon tetrachloride, and fluorotrichloromethane.

30. The method of claim 6, wherein said halogen source gas is selected from the group cnsisting of carbon tetrachloride silicon tetrachloride, and fluorotrichloromethane.

31. The method of claim 4, wherein both said carbonyl source and said halogen source are provided by the same molecular species.

32. The method of claim 5, wherein both said carbonyl source and said halogen source are provided by the same molecular species.

33. The method of claim 6, wherein both said carbonyl source and said halogen source are provided by the same molecular species.

34. The method of claim 31, wherein said carbonyl source and said halogen source are both provided by a carbonyl chloride.

35. The method of claim 32, wherein said carbonyl source and said halogen source are both provided by a carbonyl chloride.

36. The method of claim 33, wherein said carbonyl source and said halogen source are both provided by a carbonyl chloride.

37. The method of claim 34, wherein said carbonyl chloride comprises phosgene.

38. The method of claim 35, wherein said carbonyl chloride comprises phosgene.

39. The method of claim 36, wherein said carbonyl chloride comprises phosgene.

40. The method of claim 2, wherein said metal is selected from the group consisting of tungsten and molybdenum.

41. The method of claim 5, wherein said metal is selected from the group consisting of tungsten and molybdenum.

42. The method of claim 5, wherein said metal is selected from the group consisting of iron, chromium, nickel, cobalt, vanadium, and manganese.

43. The method of claim 5, wherein said metal is selected from the group consisting of iron, chromium, nickel, cobalt, vanadium, and manganese.

44. The method of claim 2, wherein said metal is selected from the group consisting of copper, silver, and gold.

45. The method of claim 2, wherein said metal is selected from the group consisting of copper, silver, and gold.

* * * * *